United States Patent [19]

Takai

[11] Patent Number: 5,532,642

[45] Date of Patent: Jul. 2, 1996

[54] FEEDFORWARD-TYPE DISTORTION COMPENSATION CIRCUIT

[75] Inventor: Kenichi Takai, Tokyo, Japan

[73] Assignee: NEC Corporation, Tokyo, Japan

[21] Appl. No.: 400,878

[22] Filed: Mar. 8, 1995

[30] Foreign Application Priority Data

Mar. 10, 1994 [JP] Japan .................................. 6-065484

[51] Int. Cl.$^6$ ..................................................... H03F 1/32
[52] U.S. Cl. ................................................. 330/15; 330/52
[58] Field of Search ............................. 330/52, 149, 151

[56] References Cited

U.S. PATENT DOCUMENTS 5,155,448  10/1992  Powell ..................................... 330/149
5,166,634  11/1992  Narahashi et al. ...................... 330/151

FOREIGN PATENT DOCUMENTS 61-121607   6/1986   Japan .
1-198809    8/1989   Japan .
4-83406     3/1992   Japan .
4-70203     3/1992   Japan .
4-364602   12/1992   Japan .

Primary Examiner—James B. Mullins
Attorney, Agent, or Firm—Foley & Lardner

[57] ABSTRACT

A feedforward-type distortion compensation circuit which can compensate for a non-linear distortion component generated by a main amplifier. The circuit has a main amplifier path in which the main amplifier, a first variable attenuator and a first variable phase shifter are interposed, first and second delay line paths, a first power distributor for distributing an input signal to the main amplifier path and the first delay line path, an auxiliary amplifier path in which an auxiliary amplifier, a second variable attenuator and a second variable phase shifter are interposed, a second power distributor interconnecting the main amplifier path and the second delay line path, a first power combiner interconnecting the first delay line path and the auxiliary amplifier path, a second power combiner combining the signals from the second delay line path ant the auxiliary amplifier path to output, and a signal transmission path connecting between the branch ends of the second power distributor and the first power combiner. First and second pilot signals are coupled with the input signal and the signal transmitting the main amplifier path, respectively. The first variable attenuator and the first variable phase shifter are controlled in response to level and phase differences of the first pilot signal components at the first power combiner, respectively. Similarly, the second variable attenuator and the second variable phase shifter are controlled in response to level and phase differences of the second pilot signal components at the second power combiner, respectively.

15 Claims, 11 Drawing Sheets

FEEDFORWARD-TYPE DISTORTION COMPENSATION CIRCUIT

BACKGROUND OF THE INVENTION

1. Field of the Invention

This invention relates to a feedforward-type distortion compensation circuit, and more particularly to a distortion compensation circuit for a linear amplifier used in a radio frequency (RF) band.

2. Description of the Related Art

In a radio frequency band such as a microwave, a feedforward-type distortion compensation circuit is used to remove distortion in an input/output characteristic of an amplifier to realize a high output linear amplifier in order to reduce the power dissipation. The feedforward-type distortion compensation circuit is basically constituted from two signal cancellation circuits, i.e., a distortion detection circuit and a distortion removal circuit as disclosed, for example, in Japanese Patent Laid-Open Application No. Sho-61-121607 (JP, A, 61-121607) by Y. Yajima et al., Japanese Patent Laid-Open Application No. Hei-1-198809 (JP, A, 1-198809) by T. Nojima and Japanese Patent Laid-Open Applications Nos. Hei-4-70203 (JP, A, 4-70203) and Hei-4-83406 (JP, A, 4-83406) by Y. Narahashi et al. The distortion detection circuit includes a main amplifier and detects a distortion component included in the output of the main amplifier from a difference between an input signal to the main amplifier and an output signal of the main amplifier. Meanwhile, the distortion removal circuit includes an auxiliary amplifier and removes distortion by subtracting from the output of the main amplifier the distortion component detected by the distortion detection circuit and amplified by the auxiliary amplifier.

As an example, the feedforward-type distortion compensation circuit disclosed in above JP, A, 4-83406 is described below with reference to FIG. 1.

A distortion detection circuit 1 is constituted from a path (main amplifier path) ML including a main amplifier 8, another path (first delay line path) DL1 including a delay line 46, and a power distributor 5 for distributing an input signal to both of the paths ML and DL1. Meanwhile, a distortion removal circuit 2 is constituted from a path (second delay line path) DL2 including a delay line 47, another path (auxiliary amplifier path) SL including an auxiliary amplifier 20, and a power combiner 17 for combining signals from both of the paths DL2 and SL and outputting a resulted signal. The main amplifier path ML and the second delay line path DL2 are connected to each other by a power distributor 11, and the first delay line path DL1 and the auxiliary amplifier path SL are connected to each other by a power combiner 14. The branch side of the power distributor 11 and the branch side of the power combiner 14 are connected to each other by a signal transmission path BL.

The distortion detection circuit 1 further includes an electrically adjustable variable attenuator 6 and an electrically adjustable variable phase shifter 7. In the example shown in FIG. 1, the variable attenuator 6 and the variable phase shifter 7 are interposed in the main amplifier path ML. Alternatively, the variable attenuator 6 and the variable phase shifter 7 may be interposed in the first delay line path DL1 because the alternative arrangement does not cause a significant difference in characteristic. Similarly, the distortion removal circuit 2 includes an electrically adjustable variable attenuator 18 and an electrically adjustable variable phase shifter 19. In the example shown in FIG. 1, the variable attenuator 18 and the variable phase shifter 19 are interposed in the auxiliary amplifier path SL. Also the variable attenuator 18 and the variable phase shifter 19 may alternatively be interposed in the second delay line path DL2.

Next, operation of the feedforward-type distortion compensation circuit will be described. An input signal applied to an input terminal 26 is inputted to the distortion detection circuit 1 by way of a directional coupler 3 and distributed to the main amplifier path ML and the first delay line path DL1 by the power distributor 5. The signal component which passes through the main amplifier path ML, in which it is amplified by the main amplifier 8, and has distortion is distributed to the second delay line path DL2 and the signal transmission path BL by the power distributor 11. The signal component having passed through the signal transmission path BL and having distortion is combined with the signal component having passed through the first delay line path DL1 by the power combiner 14, and the thus combined signal is outputted to the auxiliary amplifier path SL. In this instance, the variable attenuator 6 and the variable phase shifter 7 are adjusted so that the two signal components to pass through the two paths and be inputted to the power combiner 14, i.e., the first delay line path DL1 and the signal transmission path BL, are equal in amplitude and delay amount but are opposite in phase. As a result, the signal component outputted from the power combiner 14 to the auxiliary amplifier path SL is a difference component between the signal having passed through the delay line 46 and the signal having passed through the main amplifier 8. When the variable attenuator 6 and the variable phase shifter 7 are adjusted in such a manner as described above, the difference component includes only a non-linear distortion component produced by the main amplifier 8, and accordingly, only the non-linear distortion component is outputted from the power combiner 14 to the distortion removal circuit 2.

The signal having passed through the main amplifier path ML and outputted from the power distributor 11 to the second delay line path DL2 of the distortion removal circuit 2 is combined with the signal having passed through the auxiliary amplifier path SL by the power combiner 17. In this instance, the variable attenuator 18 and the variable phase shifter 19 are adjusted so that the transfer characteristics of the two paths from the input terminal of the power distributor 11 to the output terminal of the power combiner 17, i.e., the second delay line path DL2 and the auxiliary amplifier path SL, are equal to each other in terms of amplitude and the delay amount but are opposite in terms of the phase. Since the signal passing the auxiliary amplifier path SL is a distortion component of the output signal of the main amplifier 8 as described above, by adjusting the variable attenuator 18 and the variable phase shifter 19 in this manner, the power combiner 17 combines the output signal of the main amplifier 8 and the distortion component in opposite phases and in equal amplitudes, thereby realizing cancellation of the distortion component in the output of the entire circuit.

The factors which have a significant influence on the distortion compensation performance of the feedforward-type distortion compensation circuit are the adjustment precision of the variable attenuator 6 and the variable phase shifter 7 in the distortion detection circuit 1 and the adjustment precision of the variable attenuator 18 and the variable phase shifter 19 in the distortion removal circuit 2. In short, whether distortion can be removed precisely or not depends upon whether signals can be combined by the distortion detection circuit 1 and the distortion removal circuit 2 satisfying the requirements of equal amplitudes, equal delay amounts and opposite phases. In practice, however, it is not easy to maintain the settings of the variable attenuators 6 and 18 and the variable phase shifters 7 and 19 so as to satisfy the requirements. Even if adjustment is performed by initial control so that the requirements may be satisfied completely, since the characteristic of the main amplifier 8 varies with changes in ambient temperature, small variations in power supply voltage, avariations in input power, aging and so forth, the transfer characteristics of the distortion detection circuit 1 and the distortion removal circuit 2 must follow up the changes in the characteristic of the main amplifier 8.

Therefore, the feedforward-type distortion compensation circuit disclosed in JP, A, 4-83406 mentioned above employs an oscillator 4 for generating a first pilot signal and another oscillator 9 for generating a second pilot signal so that the requirements mentioned above may be satisfied precisely when signals are combined by the distortion detection circuit 1 and the distortion removal circuit 2. In particular, the first pilot signal is coupled to the distortion detection circuit 1 by way of the directional coupler 3 whereas the first pilot signal is extracted by a directional coupler 40 provided in the auxiliary amplifier path SL of the distortion removal circuit 2 and a residual level of the first pilot signal is determined by a selective level meter 43 to detect whether combination of signals satisfying the requirements of equal amplitudes, equal delay amounts and opposite phases is performed by the distortion detection circuit 1. Since the requirements of equal amplitudes, equal delay amounts and opposite phases are satisfied at a higher degree as the residual level detected by the selective level meter 43 becomes lower, the variable attenuator 6 and the variable phase shifter 7 are adjusted by a control circuit 25 so that the residual level may be minimized in order that the requirements described above may be satisfied at the distortion detection circuit 1. Similarly, the second pilot signal is coupled to the main amplifier path ML by way of a directional coupler 10 whereas the second pilot signal is extracted by a directional coupler 41 provided on the output side of the distortion removal circuit 2 and a residual level of the second pilot signal is determined by a selective level meter 44. Then, the variable attenuator 18 and the variable phase shifter 19 are adjusted by the control circuit 25 to minimize the residual level detected by the selective level meter 44. By the adjustment just described, the requirements described above are satisfied also at the distortion removal circuit 2.

The pilot signals for adjusting the distortion detection circuit and the distortion removal circuit are also used in above patent documents JP, A, 61-121607, JP, A, 1-198809 and JP A, 4-70203. Further, T. Nojima et al. discloses in Japanese Patent Laid-Open Application No. Hei-4-344602 (JP, A, 4-364602) a feedforward interference circuit in which a spread spectrum signal is used as a pilot signal.

In the feedforward-type-distortion compensation circuit shown in FIG. 1, in order to remove the first pilot signal component from the output signal thereof, a directional coupler 42 is provided at the output of the distortion removal circuit 2 to extract the first pilot signal, and a residual level of the first pilot signal is detected by a selective level meter 45, and another directional coupler 32 is provided in the auxiliary amplifier path SL. The first pilot signal generated by the oscillator 4 successively passes through electrically adjustable variable attenuator 29 and variable phase shifter 30 and an amplifier 31 and is coupled to the auxiliary amplifier path SL by the directional coupler 32. The variable attenuator 29 and the variable phase shifter 30 are adjusted by the control circuit 25 so that the residual level detected by the selective level meter 45 may be minimized in order to minimize the level of the first pilot signal outputted from an output terminal 27.

As described above, in the feedforward-type distortion compensation circuit disclosed in JP, A, 4-83406, in order to accurately grasp the transfer characteristics of the distortion detection circuit 1 and the distortion removal circuit 2, the first and second pilot signals are coupled to those circuits and the levels of the signals are detected on the output sides of the circuits. However, the detected residual pilot signals do not directly indicate adjustment amounts for variable attenuators and variable phase shifters but are mere parameters indicating incompleteness of the signal combination requirements of equal amplitudes, equal delay amounts and opposite phases. Control amounts for the variable attenuator and the variable phase shifters must be determined based on an estimation algorithm from the residual levels of pilot signals. Consequently, an excessive burden is imposed on the control circuit 25, and moreover a large number of steps are required to reach an optimum adjustment amount. Accordingly, it is difficult for the transfer characteristics of the distortion detection circuit 1 and the distortion removal circuit 2 to follow up a sudden or small variation in characteristic.

SUMMARY OF THE INVENTION

The present invention has been made to solve the problem described above, and it is an object of the present invention to provide a feedforward-type distortion compensation circuit which realizes enhancement in adjustment precision and reduction in load to a control circuit.

The object of the present invention described above is achieved by a feedforward-type distortion compensation circuit which includes a main amplifier and which detects and compensates for a non-linear distortion component generated by the main amplifier, comprising oscillation means for generating first and second pilot signals; first coupling means for coupling the first pilot signal to an input signal; a main amplifier path; a first delay line path; a second delay line path; an auxiliary amplifier path; a signal transmission path; first signal distribution means for distributing a signal from the first coupling means to an end of the main amplifier path and an end of the first delay line path; a main amplifier interposed in the main amplifier path; second coupling means interposed in the main amplifier path for coupling the second pilot signal to a signal propagating in the main amplifier path; first variable attenuation means interposed in the main amplifier path or the first delay line path and having a controllable attenuation amount; first variable phase shifting means interposed in the main amplifier path or the first delay line path and having a controllable phase shift amount; second signal distribution means having an input terminal connected to the other end of the main amplifier path and having a pair of output terminals connected to an end of the second delay line path and an end of the signal transmission path; first signal combination means having a pair of input terminals connected to the other end of the first delay line path and the other end of the signal transmission path and having an output terminal connected to an end of the auxiliary amplifier path; an auxiliary amplifier interposed in the auxiliary amplifier path; second variable attenuation means interposed in the auxiliary amplifier path or the second delay line path and having a controllable attenuation amount; second variable phase shifting means interposed in the auxiliary amplifier path or the second delay line path and having a controllable shift amount; second signal combination means having a pair of input terminals connected to the other end of the second delay line path and the other end of the auxiliary amplifier path for outputting an output signal; phase difference detection means for detecting a difference in phase between the input terminals of the first signal combination means and for detecting a difference in phase between the input terminals of the second signal combination means; level difference detection means for detecting a difference in level between the input terminals of the first signal combination means and for detecting a difference in level between the input terminals of the second signal combination means; and control means for controlling the first and second variable attenuation means and the first and second phase shifting means in response to results of detection of the phase difference detection means and the level difference detection means so that components of the first pilot signal from the input terminals of the first power combination means are combined with equal delay amounts, in opposite phases and with equal amplitudes by the first power combination means and components of the second pilot signal from the input terminals of the second power combination means are combined with equal delay amounts, in opposite phases and with equal amplitudes by the second power combination means.

The above and other objects, features, and advantages of the present invention will become apparent from the following description referring to the accompanying drawings which illustrate examples of preferred embodiments of the present invention.

DETAILED DESCRIPTION OF THE PREFERRED EMBODIMENTS

Figure 1:
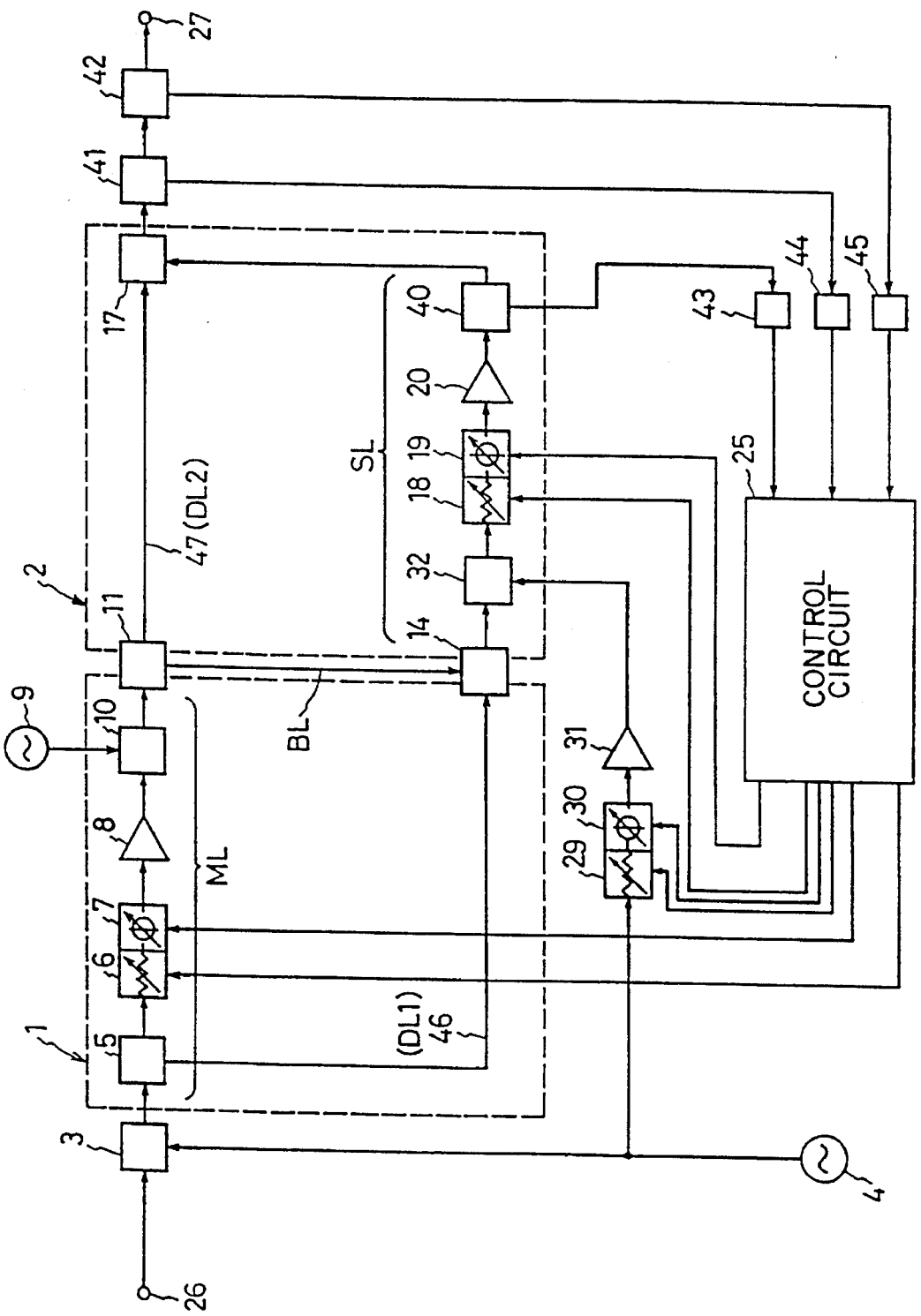
FIG. 1 is a block diagram showing an example of a conventional feedforward-type distortion compensation circuit.

The present invention is described in detail below in connection with the preferred embodiments.

FIRST EMBODIMENT

The feedforward-type distortion compensation circuit of the first embodiment of the present invention is described with reference to FIG. 2. In FIG. 2, those blocks to which the same reference characters to those of FIG. 1 are applied are the same or equivalent components to those shown in FIG. 1.

A distortion detection circuit 1 is constituted from a main amplifier path ML including a main amplifier 8, a first delay line path DL1 including a delay line 46, and a power distributor 5 for distributing an input signal to both of the main amplifier path ML and the first delay line path DL1. A distortion removal circuit 2 is constituted from a second delay line path DL2 including a delay line 47, an auxiliary amplifier path SL including an auxiliary amplifier 20, and a power combiner 17 for combining a signal from the second delay line path DL2 and another signal from the auxiliary amplifier path SL and outputting a resulted signal to an output terminal 27. The feedforward-type distortion compensation circuit further includes a power distributor 11 for connecting the main amplifier path ML and the second delay line path DL2, and a power combiner 14 for connecting the first delay line path DL1 and the auxiliary amplifier path SL. The branch side of the power distributor 11 and the branch side of the power combiner 14 are connected to each other by a signal transmission path BL. The distortion detection circuit 1 and the distortion removal circuit 2 are connected by the power distributor 11 and the power combiner 14.

Figure 2:
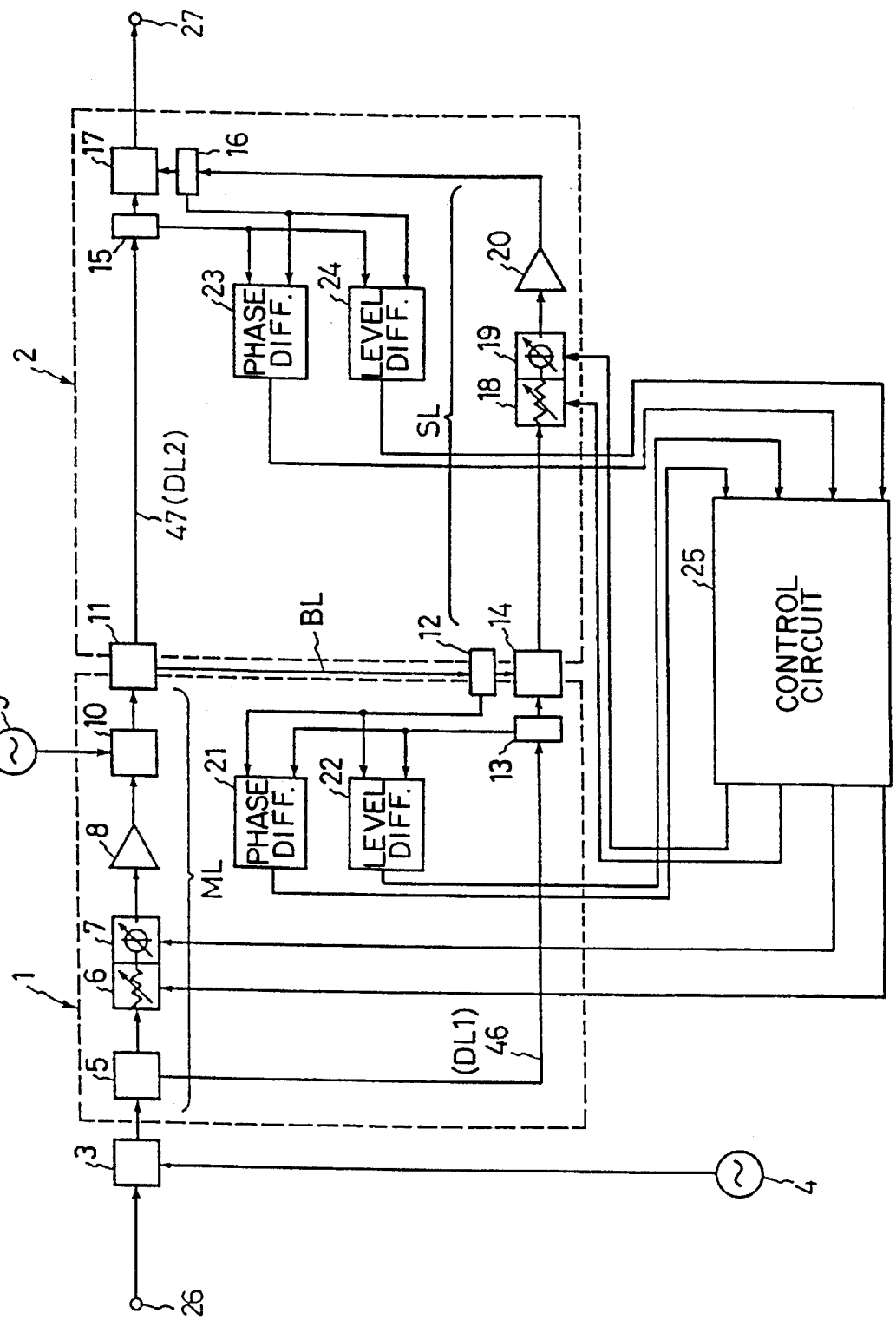
FIG. 2 is a block diagram showing the construction of a feedforward-type distortion compensation circuit of a first embodiment of the present invention.

In the present embodiment, the feedforward-type distortion compensation circuit further includes, similarly to the conventional feedforward-type distortion compensation circuit shown in FIG. 1, an oscillator 4 for generating a first pilot signal of a particular frequency and another oscillator 9 for generating a second pilot signal of a frequency different from that of the first pilot signal. A directional coupler 3 is interposed between an input terminal 26 and an input terminal of the power distributor 5 in the distortion detection circuit 1 so that the first pilot signal may be coupled at the directional coupler 3. Another directional coupler 10 for coupling the second pilot signal to an output signal of the main amplifier 8 is interposed between the main amplifier 8 and the power distributor 11 in the main amplifier path ML. The directional coupler 10 may be provided otherwise on the input side with respect to the main amplifier 8 only if it is within the main amplifier path ML.

Further, an electrically adjustable variable attenuator 6 and an electrically adjustable variable phase shifter 7 are interposed between the power distributor 5 and the main amplifier 8 in the main amplifier path ML (see FIG. 2). Either one of the variable attenuator 6 and the variable phase shifter 7 may be positioned on the input side. Further, one or both of the variable attenuator 6 and the variable phase shifter 7 may otherwise be interposed in the first delay line path DL1 (see FIG. 3). Similarly, an electrically adjustable variable attenuator 18 and an electrically adjustable variable phase shifter 19 are interposed between the power combiner 14 and the auxiliary amplifier 20 in the auxiliary amplifier path 56 (see FIG. 2) DL2. Either one of the variable attenuator 18 and the variable phase shifter 19 may be positioned on the input side. Further, one or both of the variable attenuator 18 and the variable phase shifter 19 may otherwise be interposed in the second delay line path DL2 (see FIG. 2). A control circuit 25 is provided to control the variable attenuators 6 and 18 and the variable phase shifters 7 and 19.

A pair of directional couplers 12 and 13 are connected to two input terminals of the power combiner 14, and coupling output terminals of the directional couplers 12 and 13 are connected to a phase difference detection circuit 21 and also to a level difference detection circuit 22. The phase difference detection circuit 21 detects a difference in phase between the first pilot signal components extracted from the directional couplers 12 and 13, and the level difference detection circuit 22 detects a difference in level between the first pilot signal components extracted from the directional couplers 12 and 13. Similarly, a pair of directional couplers 15 and 16 are connected to two input terminals of the power combiner 17 of the distortion removal circuit 2, and coupling output terminals of the directional couplers 15 and 16 are connected to another phase difference detection circuit 23 and also to another level difference detection circuit 24. The phase difference detection circuit 23 detects a difference in phase between the second pilot signal components to the two input terminals of the power combiner 17, and the level difference detection circuit 24 detects a difference in level between the second pilot signal components to the two input terminals of the power combiner 17. The outputs of the phase difference detection circuits 21 and 23 and the outputs of the level difference detection circuits 22 and 24 are inputted to the control circuit 25. The control circuit 25 controls the variable attenuator 6 and the variable phase shifter 7 based on results of detection of the phase difference detection circuit 21 and the level difference detection circuit 22 so that the first pilot signal components are combined with equal delay amounts, in opposite phases and with equal amplitudes with each other by the power combiner 14, and further controls the variable attenuator 18 and the variable phase shifter 19 based on results of detection of the phase difference detection circuit 23 and the level difference detection circuit 24 so that the second pilot signal components may be combined with equal delay amounts, in opposite phases and with equal amplitudes with each other by the power combiner 17.

Next, operation of the feedforward-type distortion compensation circuit will be described.

An input signal applied to the input terminal 26 is inputted to the distortion detection circuit 1 and distributed to the main amplifier path ML and the first delay line path DL1 by the power distributor 5. The signal distributed to the main amplifier path ML is amplified by the main amplifier 8, from which it is outputted as an amplified signal having distortion. The amplified signal is distributed to the second delay line path DL2 and the signal transmission path BL by the power distributor 11. The amplified signal distributed to the signal transmission path BL is combined, by the power combiner 14, with the input signal having passed through the first delay line path DL1. In this instance, if the requirements that the signal components at the input terminals of the power combiner 14 from the two paths are equal in terms of the amplitude and the delay amount but are opposite in terms of the phase are satisfied, only the distortion component generated by the main amplifier 8 is detected as the output of the distortion detection circuit 1 from the output of the power combiner 14.

The first pilot signal coupled from the oscillator 4 to the distortion detection circuit 1 by way of the directional coupler 3 follows the same paths as the input signal. The first pilot signal component having passed through the main amplifier 8 is extracted by the directional coupler 12 while the first pilot signal component having passed through the first delay line path DL1 (delay line 46) is extracted by the directional coupler 13, and the thus extracted two first pilot signal components are inputted to the phase difference detection circuit 21. The phase difference detection circuit 21 detects a difference in phase between the first pilot signals from the two paths. Similarly, a difference in level between the first pilot signals from the two paths is detected by the level difference detection circuit 22. The control circuit 25 adjusts the variable attenuator 6 and the variable phase shifter 7, respectively, using the level difference and the phase difference thus detected as adjustment amounts so that the thus detected phase difference between the first pilot signals may be 180 degrees or the first pilot signal components to be combined by the power combiner 14 may be equal in delay amount but opposite in phase and the detection level difference between the first pilot signals may be minimum.

Meanwhile, the distortion component detected by the distortion detection circuit 1 is inputted to the distortion removal circuit 2 and passes through the auxiliary amplifier path SL, in which the distortion component is amplified by the auxiliary amplifier 20. The amplified signal from the auxiliary amplifier 20 is combined by the power combiner 17 with the amplified signal which has passed through the second delay line path DL2 and includes distortion. The second pilot signal coupled from the oscillator 9 by the directional coupler 10 is distributed to the second delay line path DL2 and the signal transmission path BL by the power distributor 11. The second pilot signal sent out to the signal transmission path BL and passing through the power combiner 14 is amplified to a required level by the auxiliary amplifier 20 and then inputted to the power combiner 17. The power combiner 17 thus combines the second pilot signal component amplified by the auxiliary amplifier 20 and the second pilot signal component having passed through the second delay line path DL2. In this instance, the second pilot signal component having passed through the second delay line path DL2 (delay line 47) is extracted by the directional coupler 15 while the second pilot signal component having passed through the auxiliary amplifier 20 is extracted by the directional coupler 16. As a result, a difference in phase between the second pilot signal components from the two paths is detected by the phase difference detection circuit 23, and a difference in level between the second pilot signal components from the two paths is detected by the level difference detection circuit 24.

The control circuit 25 adjusts the variable attenuator 18 and the variable phase shifter 19, respectively, using the level difference and the phase difference thus detected as adjustment amounts so that the thus detected phase difference between the second pilot signals may be 180 degrees or the second pilot signal components to be combined by the power combiner 17 may be equal in delay amount but opposite in phase and the detection level difference between the second pilot signals may be minimum. In this instance, if the requirements that the transfer characteristics of the two paths from the input terminal of the power distributor 11 to the output terminal of the power combiner 17, i.e., the second delay line path DL2 and the auxiliary amplifier path SL, are equal in terms of the amplitude and the delay amount but are opposite in terms of the phase are satisfied, then the output of the feedforward-type distortion compensation circuit is free from the distortion component generated by the main amplifier 8 and only exhibits the signal amplified by the main amplifier 8.

The feedforward-type distortion compensation circuit can operate very stably by performing the control described above continuously or intermittently.

As described above, in the feedforward-type distortion compensation circuit, incompleteness of the signal cancellation requirements with the distortion detection circuit 1 and an error component of the signal cancellation of the distortion detection circuit 1 are detected by the phase difference detection circuit 21 and the level difference detection circuit 22, and the thus detected information is used for adjustment amounts for the variable attenuator 6 and the variable phase shifter 7. Similarly, incompleteness of the signal cancellation requirements with the distortion removal circuit 2 and an error component of the signal cancellation of the distortion removal circuit 2 are detected by the phase difference detection circuit 23 and the level difference detection circuit 24, and the thus detected information is used for adjustment amounts for the variable attenuator 18 and the variable phase shifter 19. In other words, the signal cancellation requirements of the distortion detection circuit 1 and the distortion removal circuit 2 are automatically optimally adjusted in response to the results of detection of the phase difference detection circuits 21 and 23 and the level difference detection circuits 22 and 24, and consequently, an optimum transfer characteristic of the circuit is maintained. In the present embodiment, since the adjustment amounts of the variable attenuators 6 and 18 and the variable phase shifters 7 and 19 are indicated directly by phase differences detected by the phase difference detection circuits 21 and 23 and level differences detected by the level difference detection circuits 22 and 24, respectively, the number of steps required for control can be reduced, and moreover, since any variation in transfer characteristic of the circuit which arises from a change in environment and so forth, from a small variation to a sudden variation, can be detected and compensated for precisely, a stabilized balanced condition can be maintained.

SECOND EMBODIMENT

Figure 3:
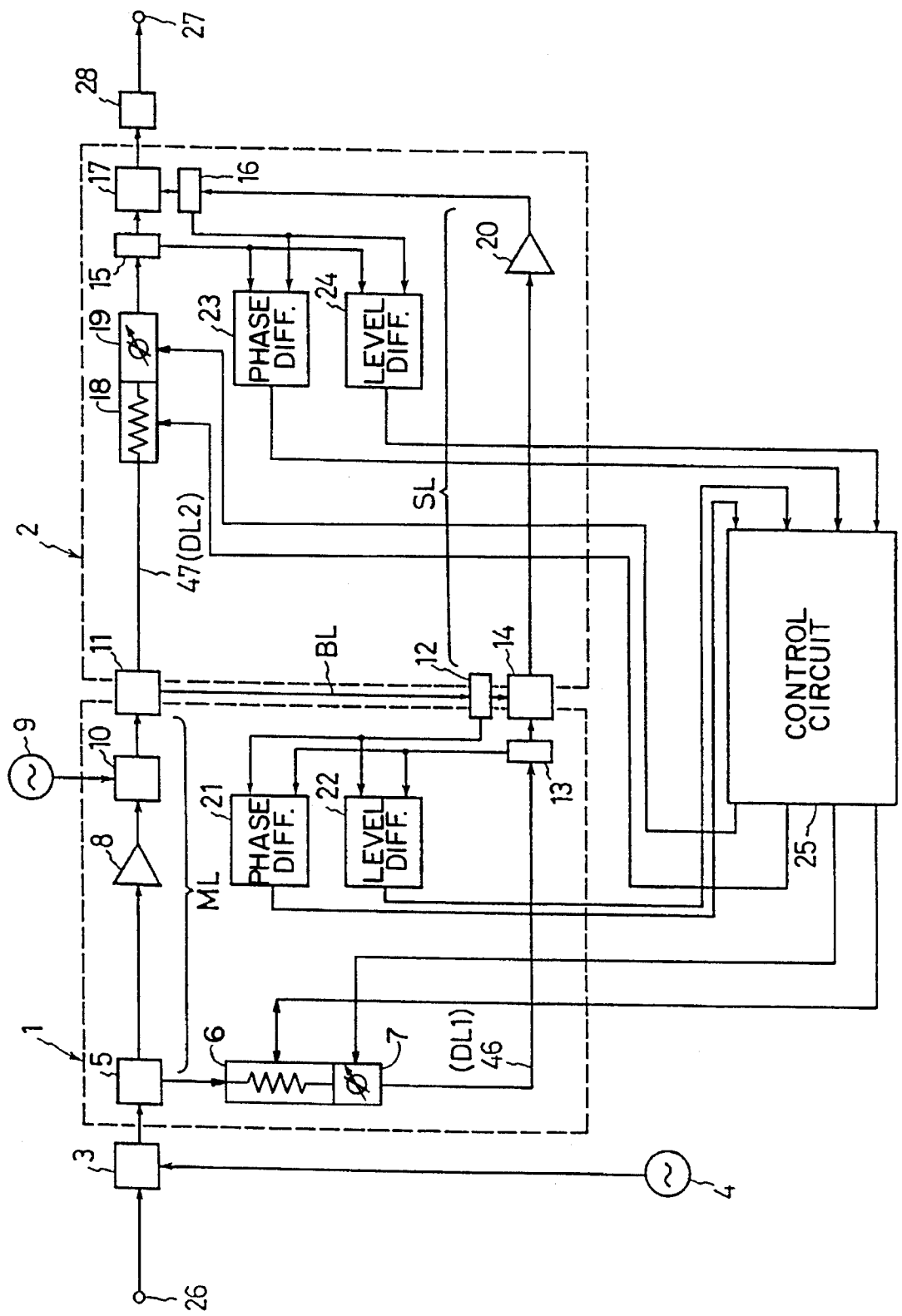
FIG. 3 is a block diagram showing the construction of a feedforward-type distortion compensation circuit of a second embodiment of the present invention.

The second embodiment of the present invention is described with reference to FIG. 3. In FIG. 3, those blocks to which the same reference characters to those of FIG. 2 are applied are the same or equivalent components to those shown in FIG. 2. The second embodiment of the invention shows an alternative arrangement, previously described with respect to FIG. 2, wherein the variable attenuator 6 and the variable phase shifter 7 are interposed in the first delay line path DL1 and the variable attenuator 18 and the variable phase shifter 19 are interposed in the second delay line path DL2. As discussed with respect to FIG. 2, one or both of the variable attenuator 6 and the variable phase shifter 7 may otherwise be interposed between the power distributor 5 and the main amplifier 8, and one or both of the variable attenuator 18 and the variable phase shifter 19 may otherwise be interposed between the power combiner 14 and the auxiliary amplifier 20.

The present feedforward-type distortion compensation circuit is a modification of but is different from the feedforward-type distortion compensation circuit shown in FIG. 2 in that a bandpass filter 28 for removing a first pilot signal is interposed between the power combiner 17 and the output terminal 27. Due to the presence of the bandpass filter 28, when a first pilot signal coupled from the oscillator 4 by way of the directional coupler 3 is outputted from the power combiner 17 by way of the second delay line path DL2, even when the signal cancellation requirements are satisfied with the power combiner 14, the first pilot signal component can be removed from the signal to be outputted from the output terminal 27. Other operations of the feedforward-type distortion compensation circuit are similar to those of the embodiment shown in FIG. 2, and accordingly, overlapping description thereof is omitted herein.

THIRD EMBODIMENT

Figure 4:
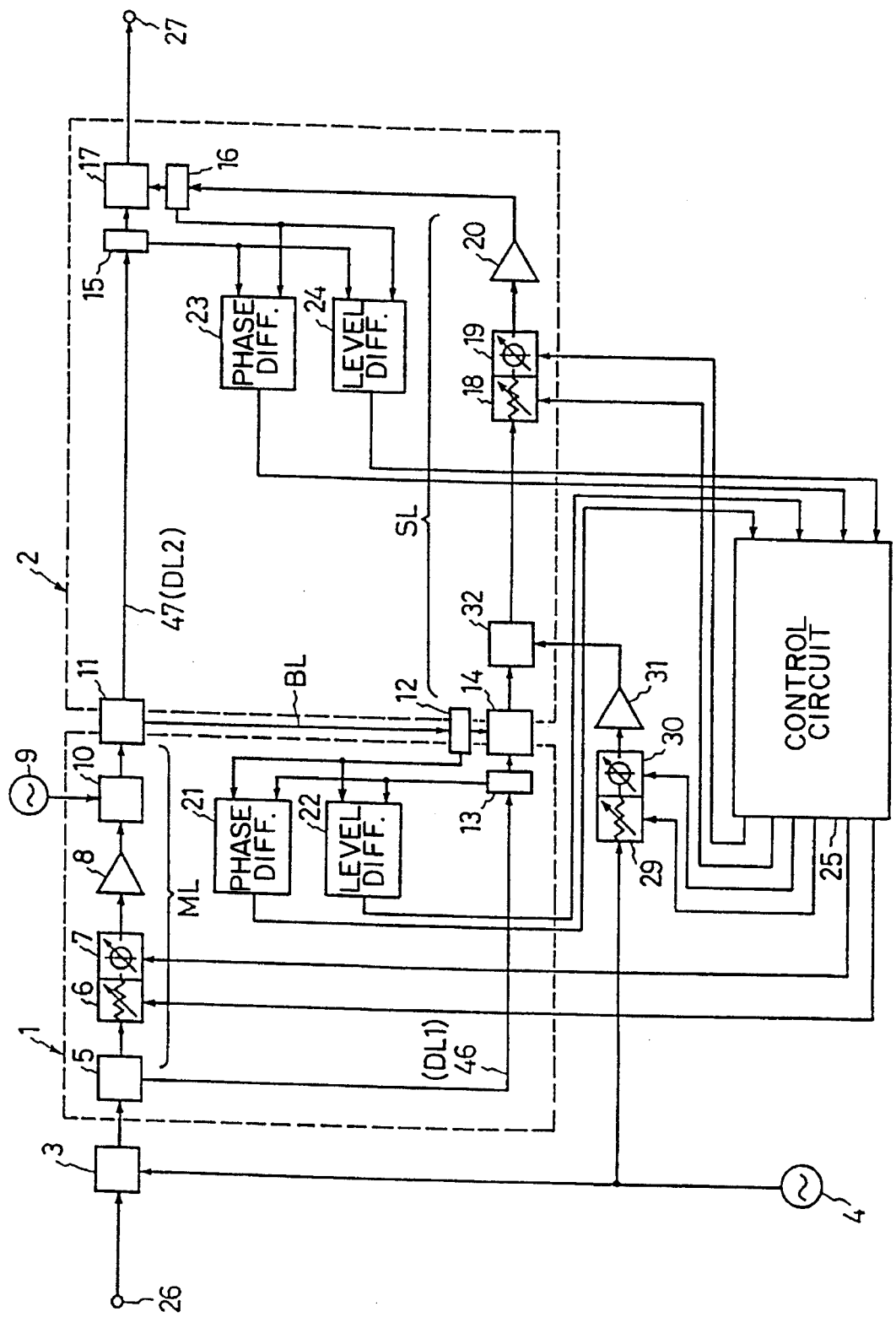
FIG. 4 is a block diagram showing the construction of a feedforward-type distortion compensation circuit of a third embodiment of the present invention.

The third embodiment of the present invention is described with reference to FIG. 4. In FIG. 4, those blocks to which the same reference characters to those of FIG. 2 are applied are the same or equivalent components to those shown in FIG. 2.

The present feedforward-type distortion compensation circuit is a modification of but is different from the feedforward-type distortion compensation circuit shown in FIG. 2 in that a first pilot signal from the oscillator 4 passes through a variable attenuator 29, a variable phase shifter 30 and an amplifier 31 and is coupled to the auxiliary amplifier path SL in the distortion removal circuit 2 by a directional coupler 32. The first pilot signal coupled to the auxiliary amplifier path SL is combined with a first pilot signal component having passed through the second delay line path DL2. In this instance, the first, pilot signal having passed through the second delay line path DL2 is extracted by the directional coupler 15 while the first pilot signal having passed through the auxiliary amplifier 20 is extracted by the directional coupler 16, and a difference in phase between the first pilot signals from the two paths is detected by the phase difference detection circuit 23 while a difference in level between the first pilot signals from the two paths is similarly detected by the level difference detection circuit 24.

The control circuit 25 adjusts the variable attenuator 29 and the variable phase shifter 30 so that the thus detected phase difference between the first pilot signals may be 180 degrees or the first pilot signals to be combined by the power combiner 17 may be equal in delay amount but opposite in phase and the detected level difference between the first pilot signals may be minimized. By the adjustment just described, the first pilot signal component having passed through the second delay line path DL2 can be removed from the signal appearing at the output terminal 27.

FOURTH EMBODIMENT

Figure 5:
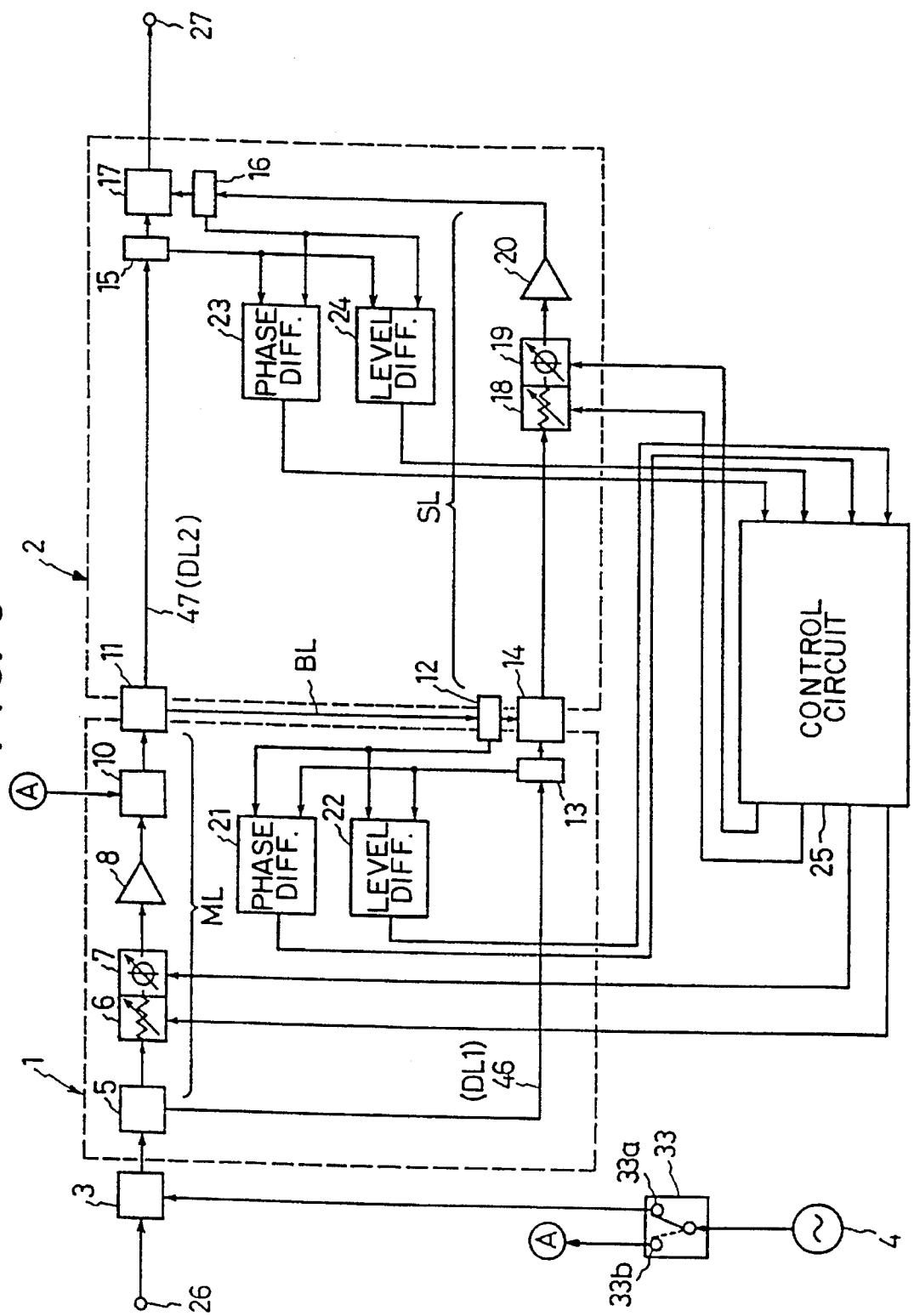
FIG. 5 is a block diagram showing the construction of a feedforward-type distortion compensation circuit of a fourth embodiment of the present invention.

The fourth embodiment of the present invention is described below with reference to FIG. 5. In FIG. 5, those blocks to which the same reference characters to those of FIG. 2 are applied are the same or equivalent components to those shown in FIG. 2.

The present feedforward-type distortion compensation circuit is a modification of but is different from the feedforward-type distortion compensation circuits described above in that, while, in the embodiments described above, first and second pilot signals are generated using the two oscillators 4 and 9 having different oscillation frequencies, in the present embodiment, only the oscillator 4 is used to generate first and second pilot signals of an equal frequency. In particular, a signal switching unit 33 is provided on the output side of the oscillator 4, and an output terminal 33a of the signal switching unit 33 is connected to the directional coupler 3 while the other output terminal 33b is connected to the directional coupler 10. Due to the provision of the signal switching unit 33, the first pilot signal and the second pilot signal of the equal frequency can be coupled while being switched with respect to time. When the signal switching unit 33 is switched to the directional coupler 3 side so that the first pilot signal is coupled, a phase difference and a level difference between the first pilot signals are detected by the phase difference detection circuit 21 and the level difference detection circuit 22, respectively, and the variable attenuator 6 and the variable phase shifter 7 in the distortion detection circuit 1 are adjusted in response to the phase difference and the level difference by the control circuit 25. Similarly, when the second pilot signal is coupled to the directional coupler 10, a phase difference and a level difference between the second pilot signals are detected by the phase difference detection circuit 23 and the level difference detection circuit 24, respectively, and the variable attenuator 18 and the variable phase shifter 19 in the distortion removal circuit 2 are adjusted in response to the phase difference and the level difference. The distortion detection circuit 1 and the distortion removal circuit 2 are controlled by switching the signal switching unit 33 at suitable timings.

FIFTH EMBODIMENT

Figure 6:
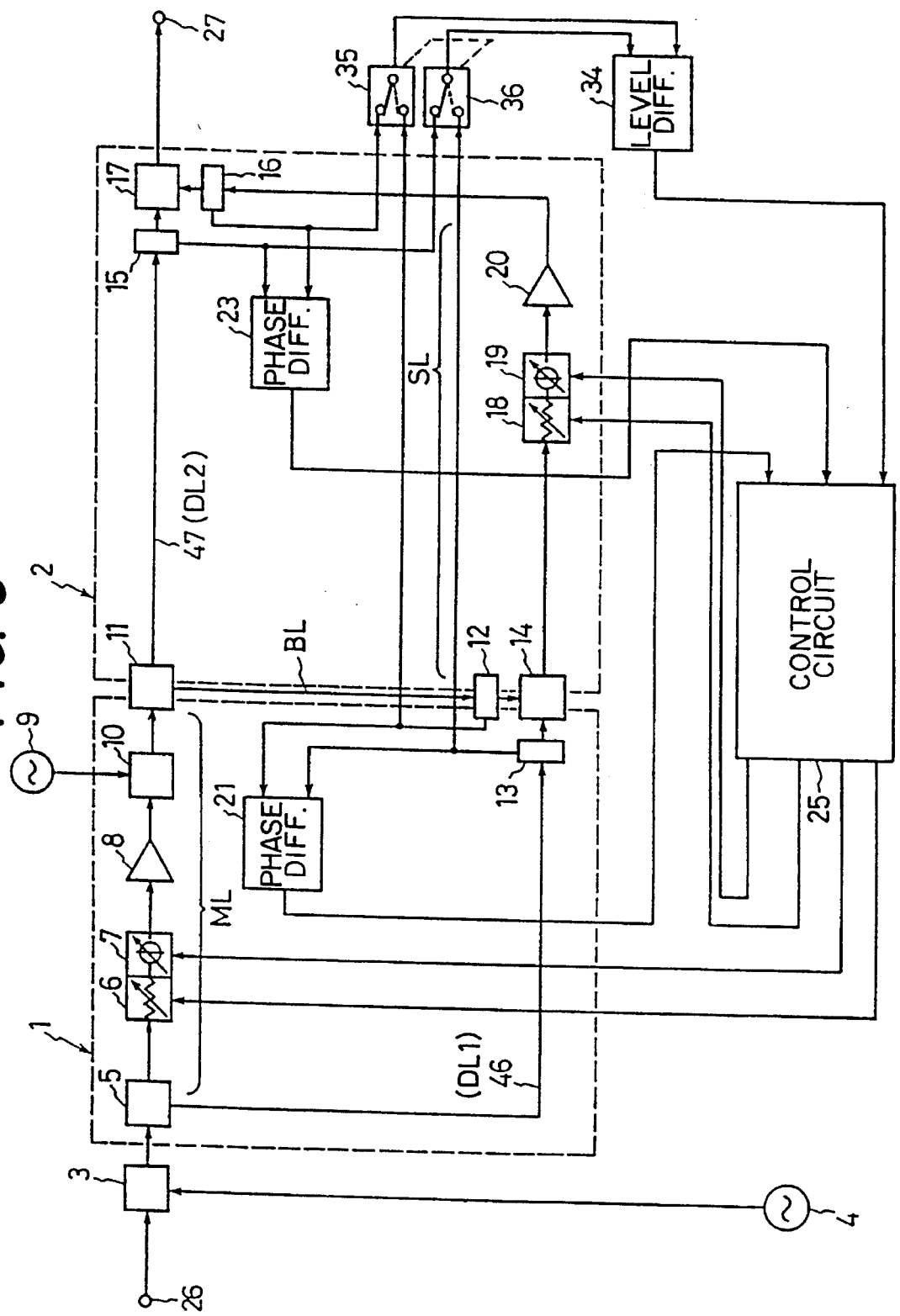
FIG. 6 is a block diagram showing the construction of a feedforward-type distortion compensation circuit of a fifth embodiment of the present invention.

The fifth embodiment of the present invention is described with reference to FIG. 6. While, in the embodiments described above, the two level difference detection circuits 22 and 24 are provided corresponding to the power combiners 14 and 17, respectively, in the present embodiment, a single level difference detection circuit 34 is provided commonly to the power combiners 14 and 17. Further, a signal switching unit 35 for switching between the directional coupler 12 and the directional coupler 16 and another signal switching unit 36 for switching between the directional coupler 13 and the directional coupler 15 are provided at two input terminals of the level difference detection circuit 34. The signal switching units 35 and 36 are linked with each other, and by switching the signal switching units 35 and 36, the level difference detection circuit 34 detects either a level difference between the first pilot signals at the power combiner 14 or a level difference between the second pilot signals at the power combiner 17. The distortion detection circuit 1 and the distortion removal circuit 2 are controlled by performing switching of the signal switching units 35 and 36 at suitable timings. Other operations of the feedforward-type distortion compensation circuit of the present embodiment are similar to those of the embodiment shown in FIG. 2, and accordingly, overlapping description thereof is omitted herein.

SIXTH EMBODIMENT

Figure 7:
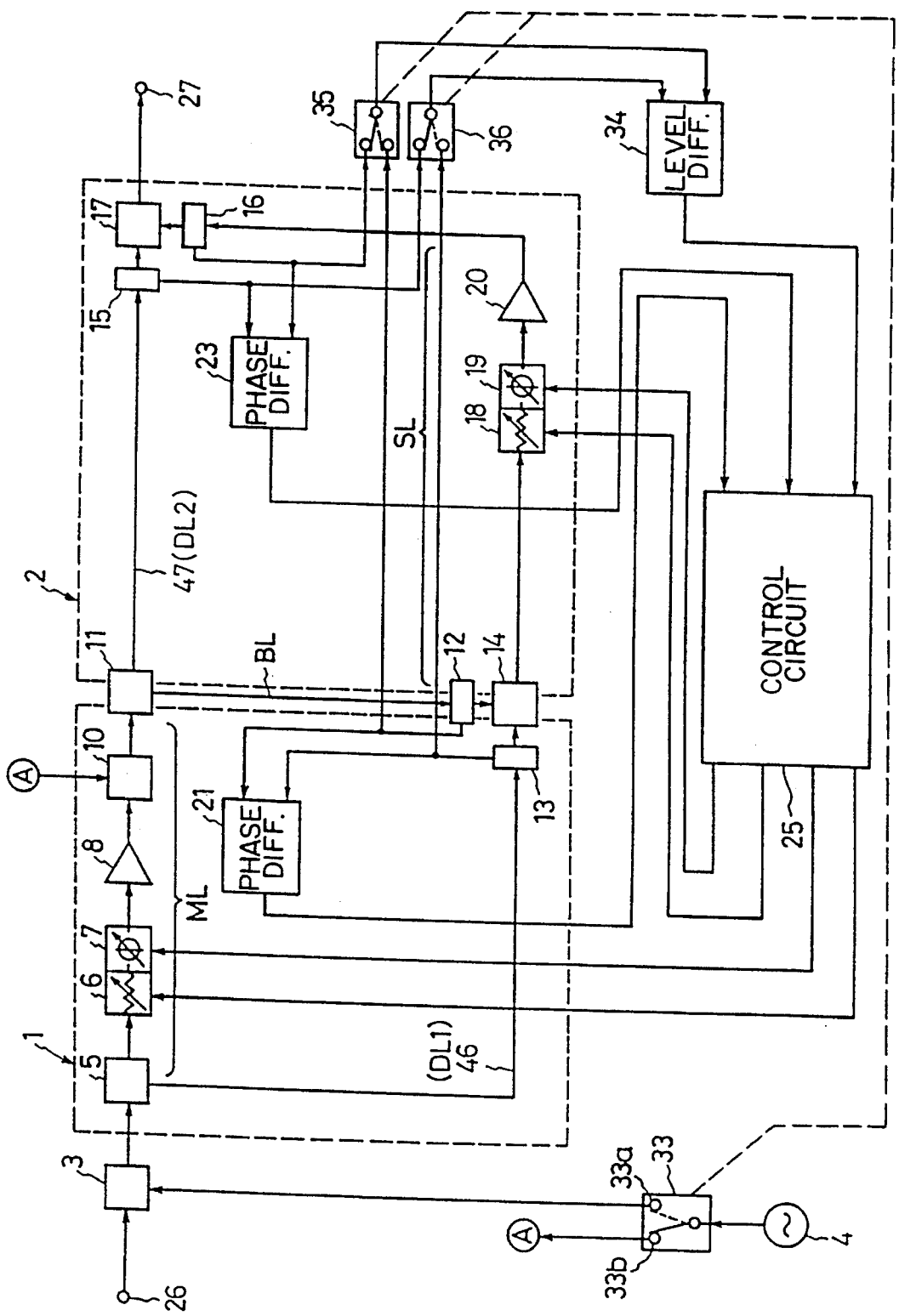
FIG. 7 is a block diagram showing the construction of a feedforward-type distortion compensation circuit of a sixth embodiment of the present invention.

The sixth embodiment of the present invention is described below with reference to FIG. 7. The present embodiment is a modification of and is different from the fifth embodiment described above in that first and second pilot signals are generated by the same oscillator 4 similarly as in the fourth embodiment. In particular, the feedforward-type distortion compensation circuit shown in FIG. 6 is modified so that the signal switching unit 33 is provided at the output terminal of the oscillator 4 and the output terminal 33a of the signal switching unit 33 is connected to the directional coupler 3 while the other output terminal 33b is connected to the directional coupler 10. Here, the signal switching units 33, 35 and 36 are linked with one another so that, when the first pilot signal is coupled by the signal switching unit 33, the signal switching units 35 and 36 select the directional couplers 12 and 13, respectively, and a level difference between the first pilot signal components at the input terminals of the power combiner 14 is detected by the level difference detection circuit 34. Similarly, when the second pilot signal is coupled by the signal switching unit 33, the signal switching units 35 and 36 select the directional couplers 16 and 15, respectively, and a level difference between the second pilot signal components at the input terminals of the power combiner 17 is detected by the level difference detection circuit 34. The distortion detection circuit 1 and the distortion removal circuit 2 are controlled by performing switching of the signal switching units 33, 35 and 36 at suitable timings. Other operations of the feedforward-type distortion compensation circuit of the present embodiment are similar to those of the embodiment shown in FIG. 6, and accordingly, overlapping description thereof is omitted herein.

SEVENTH EMBODIMENT

Figure 8:
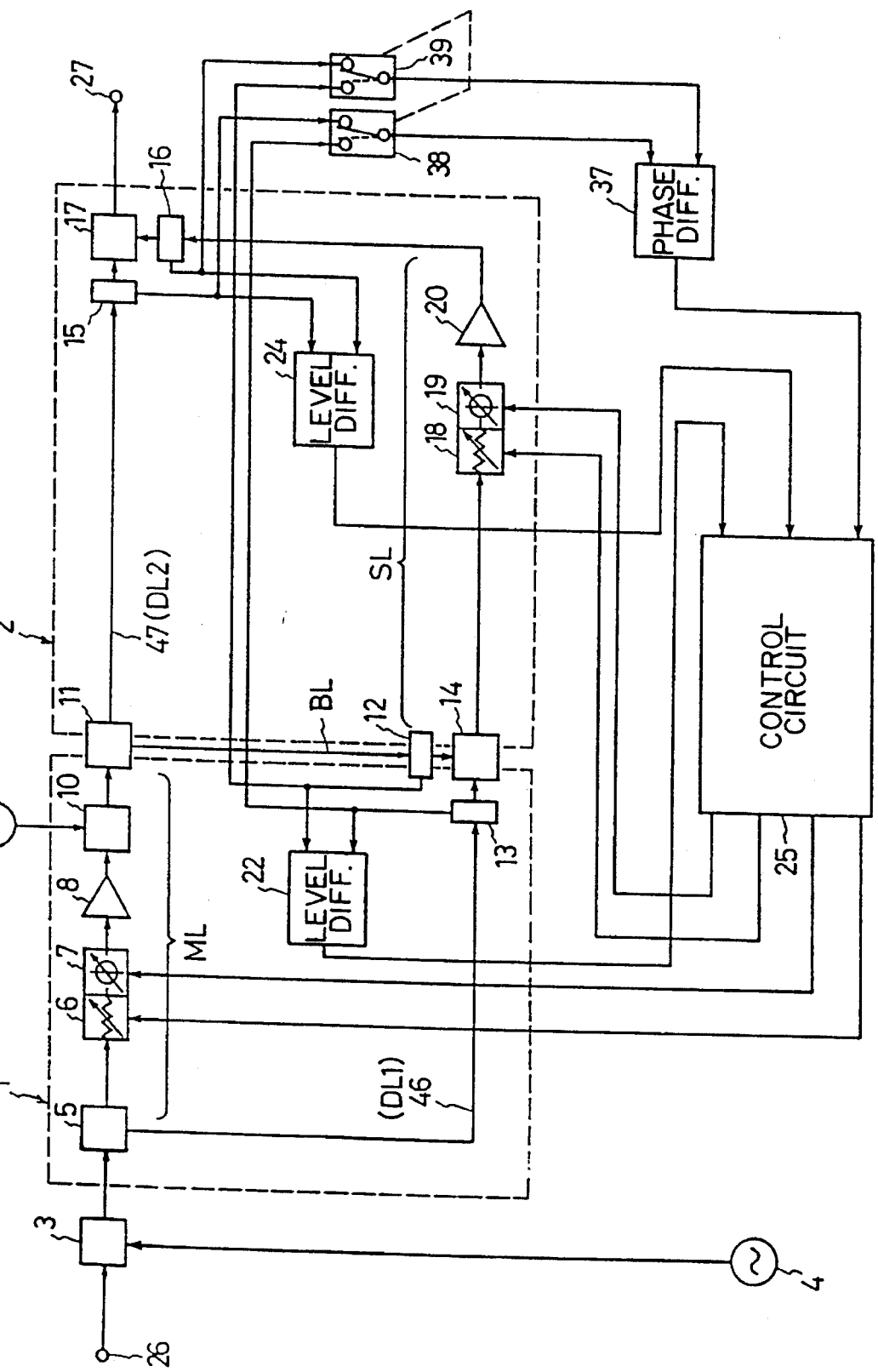
FIG. 8 is a block diagram showing the construction of a feedforward-type distortion compensation circuit of a seventh embodiment of the present invention.

The seventh embodiment of the present invention is described with reference to FIG. 8. While, in the embodiments described above, the two phase difference detection circuits 21 and 23 are provided corresponding to the power combiners 14 and 17, respectively, in the present embodiment, a single phase difference detection circuit 37 is provided commonly to the power combiners 14 and 17. Further, a signal switching unit 38 for switching between the directional coupler 13 and the directional coupler 15 and another signal switching unit 39 for switching between the directional coupler 12 and the directional coupler 16 are provided at two input terminals of the phase difference detection circuit 37. The signal switching units 38 and 39 are linked with each other, and by switching the signal switching units 38 and 39, the phase difference detection circuit 37 detects either a phase difference between the first pilot signals at the power combiner 14 or a phase difference between the second pilot signals at the power combiner 17. The distortion detection circuit 1 and the distortion removal circuit 2 are controlled by performing switching of the signal switching units 38 and 39 at suitable timings. Other operations of the feedforward-type distortion compensation circuit of the present embodiment are similar to those of the embodiment shown in FIG. 2, and accordingly, overlapping description thereof is omitted herein.

EIGHTH EMBODIMENT

Figure 9:
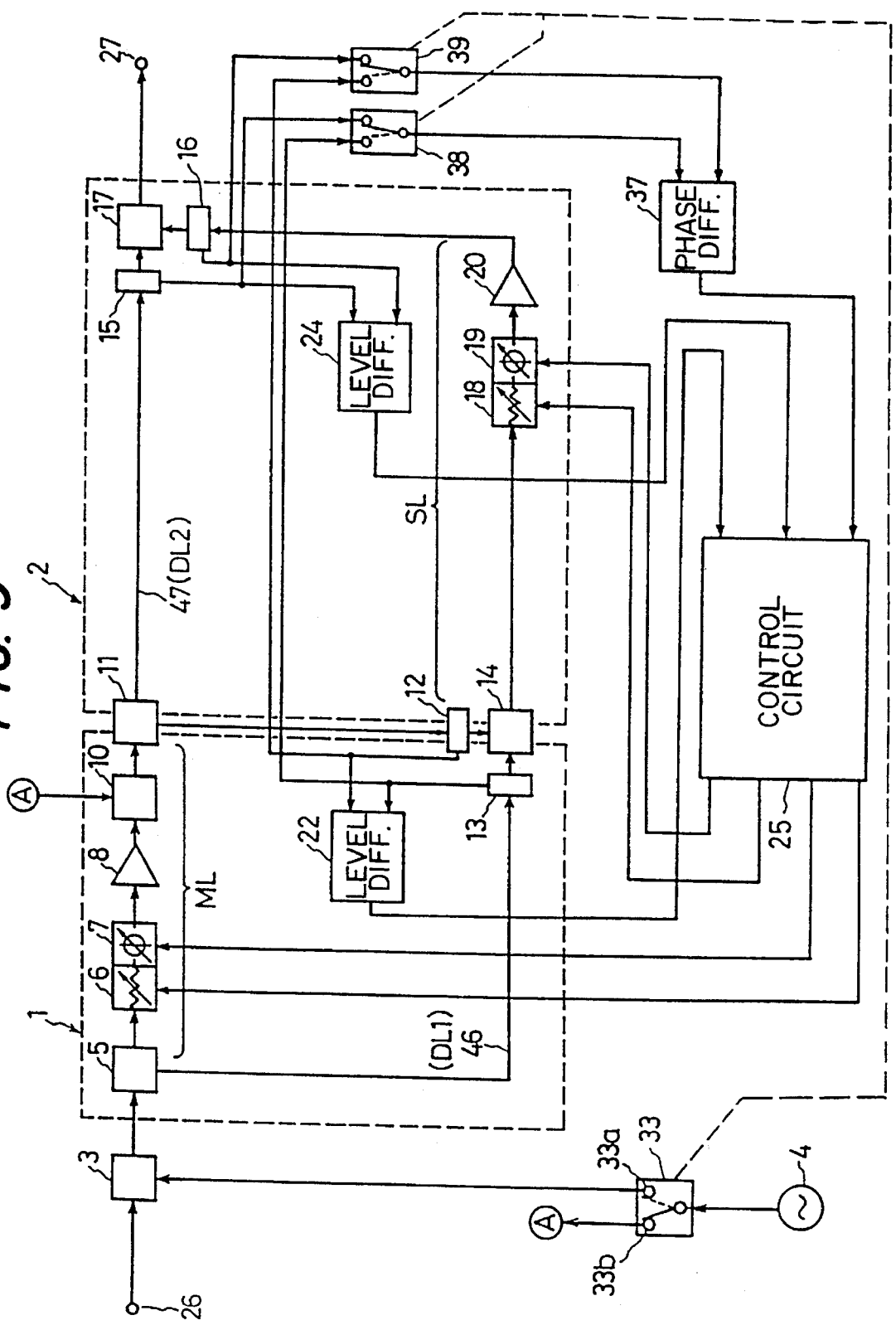
FIG. 9 is a block diagram showing the construction of a feedforward-type distortion compensation circuit of an eighth embodiment of the present invention.

The eighth embodiment of the present invention is described below with reference to FIG. 9. The present embodiment is a modification of and is different from the seventh embodiment-described above in that first and second pilot signals are generated by the same oscillator 4 similarly as in the fourth embodiment. In particular, the feedforward-type distortion compensation circuit shown in FIG. 8 is modified so that the signal switching unit 33 is provided at the output terminal of the oscillator 4 and the output terminal 33a of the signal switching unit 33 is connected to the directional coupler 3 while the other output terminal 33b is connected to the directional coupler 10. Here, the signal switching units 33, 38 and 39 are linked with one another so that, when the first pilot signal is coupled by the signal switching unit 33, the signal switching units 38 and 39 select the directional couplers 13 and 12, respectively, and a phase difference between the first pilot signal components at the input terminals of the power combiner 14 is detected by the phase difference detection circuit 37. Similarly, when the second pilot signal is coupled by the signal switching unit 33, the signal switching units 38 and 39 select the directional couplers 15 and 16, respectively, and a phase difference between the second pilot signal components at the input terminals of the power combiner 17 is detected by the phase difference detection circuit 37. The distortion detection circuit 1 and the distortion removal circuit 2 are controlled by performing switching of the signal switching units 33, 38 and 39 at suitable timings. Other operations of the feedforward-type distortion compensation circuit of the present embodiment are similar to those of the embodiment shown in FIG. 8, and accordingly, overlapping description thereof is omitted herein.

NINTH EMBODIMENT

Figure 10:
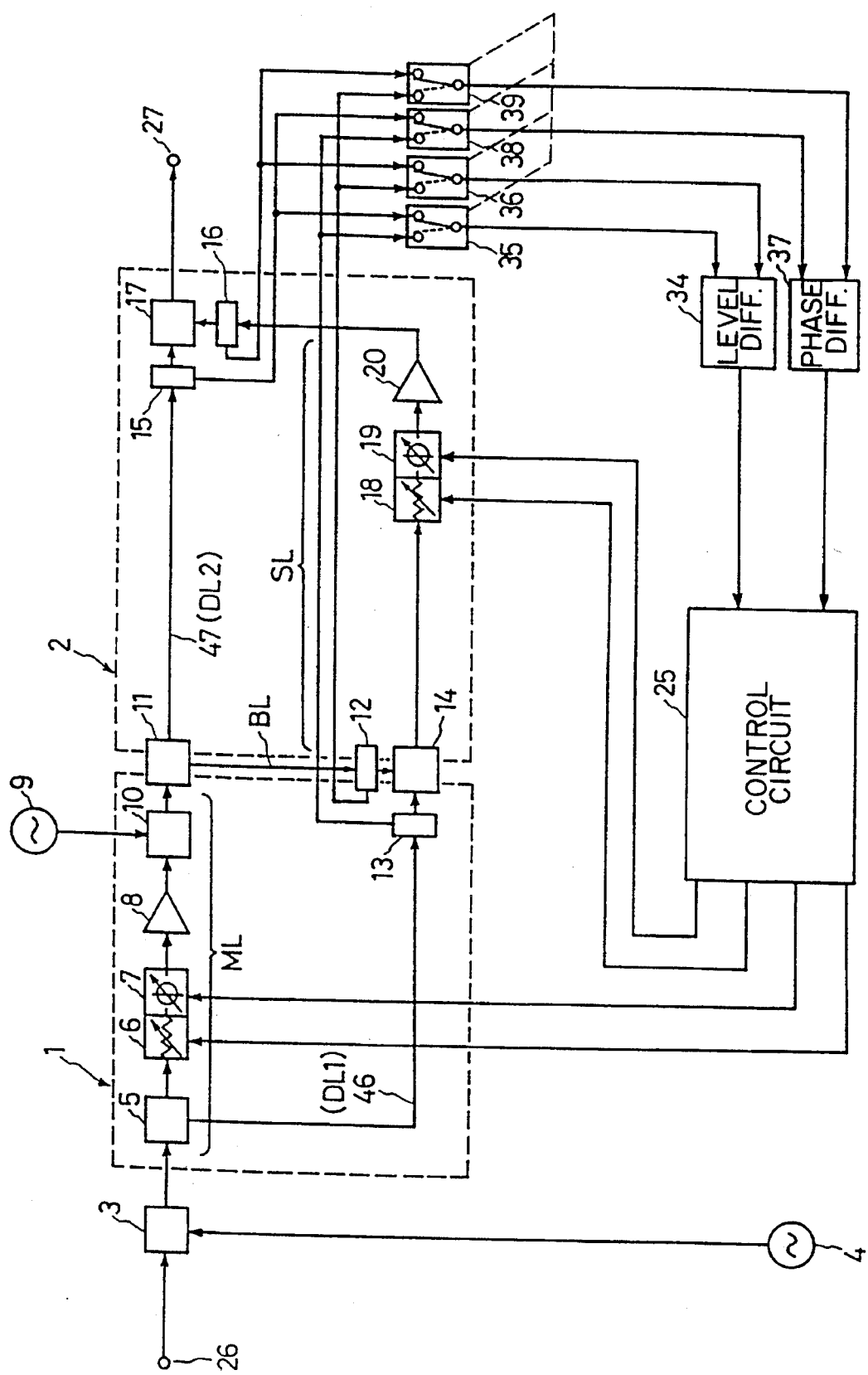
FIG. 10 is a block diagram showing the construction of a feedforward-type distortion compensation circuit of a ninth embodiment of the present invention.

The ninth embodiment of the present invention is described with reference to FIG. 10. The feedforward-type distortion compensation circuit of the present embodiment includes, in place of level difference detection circuits and phase difference detection circuits provided for the individual power combiners 14 and 17, a single level difference detection circuit 34 and a single phase difference detection circuit 37 commonly to the power combiners 14 and 17. Further, a pair of signal switching units 35 and 38 for switching between the directional coupler 12 and the directional coupler 16 are provided at one of a pair of input terminals of the level difference detection circuit 34 and one of a pair of input terminals of the phase difference detection 37, respectively, and another pair of signal switching units 36 and 38 for switching between the directional coupler 12 and the directional coupler 16 are provided at the other input terminal of the level difference detection circuit 34 and the other input terminal of the phase difference detection circuit 37, respectively.

In the feedforward-type distortion compensation circuit of the construction described above, a level difference between the first pilot signals at the power combiner 14 and a level difference between the second pilot signals at the power combiner 17 are detected by the same level difference detection circuit 34, and similarly, a phase difference between the first pilot signals at the power combiner 14 and a phase difference between the second pilot signals at the power combiner 17 are detected by the same phase difference detection circuit 37. The signal switching units 35, 36, 38 and 39 are linked with one another such that, when the signal switching units 35 and 36 are switched so that a level difference between the first pilot signals is detected by the level difference detection circuit 34, also the signal switching units 38 and 39 are switched to the first pilot signals side so that a phase difference between the first pilot signals is detected by the phase difference detection circuit 37. Similarly, when the signal switching units 35 and 36 are switched to the directional couplers 16 and 15 side, respectively, so that a level difference between the second pilot signals is detected by the level difference detection circuit 34, also the signal switching units 38 and 39 are switched to the directional couplers 16 and 15 side, respectively, so that a phase difference between the second pilot signals is detected by the phase difference detection circuit 37. The distortion detection circuit 1 and the distortion removal circuit 2 are controlled by performing switching of the signal switching units 35, 36, 38 and 39 at suitable timings. Other operations of the feedforward-type distortion compensation circuit of the present embodiment are similar to those of the embodiment shown in FIG. 2, and accordingly, overlapping description thereof is omitted herein.

TENTH EMBODIMENT

Figure 11:
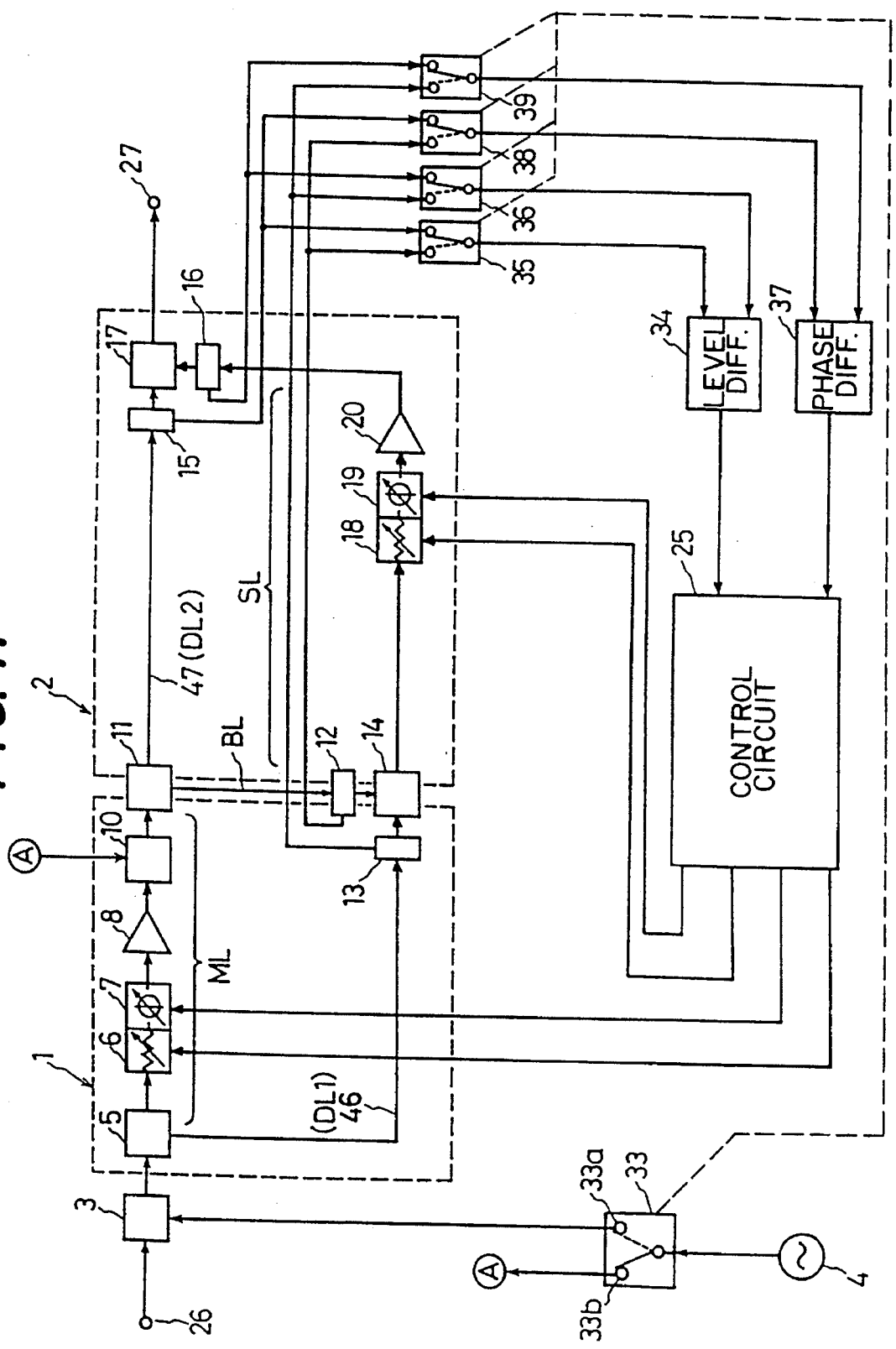
FIG. 11 is a block diagram showing the construction of a feedforward-type distortion compensation circuit of a tenth embodiment of the present invention.

The tenth embodiment of the present invention is described with reference to FIG. 11. The present embodiment is a modification of and is different from the ninth embodiment described above in that first and second pilot signals are generated by the same oscillator 4 similarly as in the fourth embodiment. In particular, the feedforward-type distortion compensation circuit shown in FIG. 10 is modified so that the signal switching unit 33 is provided at the output terminal of the oscillator 4 and the output terminal 33a of the signal switching unit 33 is connected to the directional coupler 3 while the other output terminal 33b is connected to the directional coupler 10.

Here, the signal switching units 33, 35, 36, 38 and 39 are linked with one another so that, when the first pilot signal is coupled by the signal switching unit 33, the signal switching units 35 and 38 select the directional coupler 12 and the signal switching units 36 and 39 select the directional coupler 13. As a result, a level difference and a phase difference between the first pilot signal components at the power combiner 14 are detected by the level difference detection circuit 34 and the phase difference detection circuit 37, respectively. Similarly, when the second pilot signal is coupled by the signal switching unit 33, the signal switching units 35 and 38 select the directional coupler 16 and the signal switching units 36 and 39 select the directional coupler 15. As a result, a level difference and a phase difference between the second pilot signal components at the power combiner 17 are detected by the level difference detection circuit 34 and the phase difference detection circuit 37, respectively. The distortion detection circuit 1 and the distortion removal circuit 2 are controlled by performing switching of the signal switching units 35, 36, 38 and 39 at suitable timings. Other operations of the feedforward-type distortion compensation circuit of the present embodiment are similar to those of the embodiment shown in FIG. 10, and accordingly, overlapping description thereof is omitted herein.

It is to be understood that variations and modifications of a feedforward-type distortion compensation circuit disclosed herein will be evident to those who skilled in the art. It is intended that all such modifications and variations be included within the scope of the appended claims.

What is claimed is:

1. A feedforward-type distortion compensation circuit which includes a main amplifier, and which detects and compensates for a non-linear distortion component generated by the main amplifier, comprising:

oscillation means for generating first and second pilot signals;

first coupling means for coupling the first pilot signal to an input signal;

a main amplifier path;

a first delay line path;

a second delay line path;

an auxiliary amplifier path;

a signal transmission path;

first signal distribution means for distributing a signal from the first coupling means to an end of the main amplifier path and an end of the first delay line path;

a main amplifier interposed in the main amplifier path;

second coupling means interposed in the main amplifier path for coupling the second pilot signal to a signal propagating in the main amplifier path;

a first variable attenuation means interposed in one of the main amplifier path and the first delay line path and having a controllable attenuation amount;

first variable phase shifting means interposed in one of the main amplifier path and the first delay line path and having a controllable phase shift amount;

second signal distribution means having an input terminal connected to the other end of the main amplifier path and having a pair of output terminals connected to an end of the second delay line path and an end of the signal transmission path;

first signal combination means having a pair of input terminals connected to the other end of the first delay line path and the other end of the signal transmission path and having an output terminal connected to an end of the auxiliary amplifier path;

an auxiliary amplifier interposed in the auxiliary amplifier path;

second variable attenuation means interposed in one of the auxiliary amplifier path and the second delay line path and having a controllable attenuation amount;

second variable phase shifting means interposed in one of the auxiliary amplifier path and the second delay line path and having a controllable shift amount;

second signal combination means having a pair of input terminals connected to the other end of the second delay line path and the other end of the auxiliary amplifier path for outputting an output signal;

phase difference detection means for detecting a difference in phase between the input terminals of the first signal combination means and for detecting a difference in phase between the input terminals of the second signal combination means;

level difference detection means for detecting a difference in level between the input terminals of the first signal combination means and for detecting a difference in level between the input terminals of the second signal combination means; and control means for controlling the first and second variable attenuation means and the first and second phase shifting means in response to results of detection of the phase difference detection means and the level difference detection means so that components of the first pilot signal from the input terminals of the first signal combination means are combined with equal delay amounts, in opposite phases and with equal amplitudes by the first signal combination means and components of the second pilot signal from the input terminals of the second signal combination means are combined with equal delay amounts, in opposite phases and with equal amplitudes by the second signal combination means.

2. The feedforward-type distortion compensation circuit as claimed in claim 1, wherein the oscillation means is constituted from first and second oscillators which generate different frequencies, and an output of the first oscillator is supplied as the first pilot signal to the first coupling means whereas an output of the second oscillator is supplied as the second pilot signal to the second coupling means.

3. The feedforward-type distortion compensation circuit as claimed in claim 2, further comprising a pair of first signal extraction means provided at the input terminals of the first signal combination means, and a pair of second signal extraction means provided at the input terminals of the second signal combination means, and wherein the phase difference detection means includes a first phase difference detection circuit connected to the pair of first signal extraction means for detecting a difference in phase between components of the first pilot signal at the input terminals of the first signal combination means, and a second phase difference detection circuit connected to the pair of second signal extraction means for detecting a difference in phase between components of the second pilot signal at the input terminals of the second signal combination means, and the level difference detection means includes a first level difference detection circuit connected to the pair of first signal extraction means for detecting a difference in level between components of the first pilot signal at the input terminals of the first signal combination means, and a second level difference detection circuit connected to the pair of second signal extraction means for detecting a difference in level between components of the second pilot signal at the input terminals of the second signal combination means.

4. The feedforward-type distortion compensation circuit as claimed in claim 2, further comprising a pair of first signal extraction means provided at the input terminals of the first signal combination means, and a pair of second signal extraction means provided at the input terminals of the second signal combination means, and wherein the phase difference detection means includes a single phase difference detection circuit, and first switch means for selectively connecting the first signal extraction means or the second signal extraction means to the phase difference detection means, and the level difference detection means includes a single level difference detection circuit, and second switch means for selectively connecting the first signal extraction means or the second signal extraction means to the level difference detection means.

5. The feedforward-type distortion compensation circuit as claimed in claim 2, further comprising third coupling means interposed in the auxiliary amplifier path for coupling the first pilot signal to a signal propagating in the auxiliary amplifier path, an amplifier for amplifying the first pilot signal to be inputted to the third coupling means, third variable attenuation means interposed in a path of the first pilot signal to the third coupling means and having a controllable attenuation amount, and third variable phase shifting means interposed in the path of the first pilot signal to the third coupling means and having a controllable phase shift amount, and wherein the third variable attenuation means and the third variable phase shifting means are controlled by the control means so that components of the first pilot signal from the input terminals of the second signal combination means are combined with equal delay amounts, in opposite phases and with equal amplitudes with each other by the second signal combination means.

6. The feedforward-type distortion compensation circuit as claimed in claim 1, wherein the first and second pilot signals have an equal frequency, and the oscillation means includes a single oscillator, and a change-over switch for selectively outputting an output of the oscillator to the first coupling means or the second coupling means.

7. The feedforward-type distortion compensation circuit as claimed in claim 6, further comprising a pair of first signal extraction means provided at the input terminals of the first signal combination means, and a pair of second signal extraction means provided at the input terminals of the second signal combination means, and wherein the phase difference detection means includes a first phase difference detection circuit connected to the pair of first signal extraction means for detecting a difference in phase between components of the first pilot signal at the input terminals of the first signal combination means, and a second phase difference detection circuit connected to the pair of second signal extraction means for detecting a difference in phase between components of the second pilot signal at the input terminals of the second signal combination means, and the level difference detection means includes a first level difference detection circuit connected to the pair of the first signal extraction means for detecting a difference in level between components of the first pilot signal at the input terminals of the first signal combination means, and a second level difference detection circuit connected to the pair of second signal extraction means for detecting a difference in level between components of the second pilot signal at the input terminals of the second signal combination means.

8. The feedforward-type distortion compensation circuit as claimed in claim 6, further comprising a pair of first signal extraction means provided at the input terminals of the first signal combination means, and a pair of second signal extraction means provided at the input terminals of the second signal combination means, and wherein the phase difference detection means includes a single phase difference detection circuit, and first switch means for selectively connecting the first signal extraction means or the second signal extraction means to the phase difference detection means, and the level difference detection means includes a single level difference detection circuit, and second switch means for selectively connecting the first signal extraction means or the second signal extraction means to the level difference detection means, the change-over switch, the first switch means and the second switch means being linked with each other so that the first and second switch means select the first signal extraction means when the change-over switch outputs the output of the oscillator to the first coupling means, and that the first and second switch means select the second signal extraction means when the change-over switch outputs the output of the oscillator to the second coupling means.

9. The feedforward-type distortion compensation circuit as claimed in claim 6, wherein the control means adjusts the first variable attenuation means and the first variable phase shifting means when the change-over switch outputs the output of the oscillator to the first coupling means, the control means adjusts the second variable attenuation means and the second variable phase shifting means when the change-over switch outputs the output of the oscillator to the second coupling means, and the change-over switch is switched at suitable timings.

10. The feedforward-type distortion compensation circuit as claimed in claim 1, further comprising signal removal means connected to an output terminal of the second signal combination means for removing a component of the first pilot signal from the output signal.

11. The feedforward-type distortion compensation circuit as claimed in claim 1, further comprising a pair of first signal extraction means provided at the input terminals of the first signal combination means, and a pair of second signal extraction means provided at the input terminals of the second signal combination means, and wherein the phase difference detection means includes a first phase difference detection circuit connected to the pair of first signal extraction means for detecting a difference in phase between components of the first pilot signal at the input terminals of the first signal combination means, and a second phase difference detection circuit connected to the pair of second signal extraction means for detecting a difference in phase between components of the second pilot signal at the input terminals of the second signal combination means.

12. The feedforward-type distortion compensation circuit as claimed in claim 1, further comprising a pair of first signal extraction means provided at the input terminals of the first signal combination means, and a pair of second signal extraction means provided at the input terminals of the second signal combination means, and wherein the phase difference detection means includes a single phase difference detection circuit, and switch means for selectively connecting the first signal extraction means or the second signal extraction means to the phase difference detection means.

13. The feedforward-type distortion compensation circuit as claimed in claim 1, further comprising a pair of first signal extraction means provided at the input terminals of the first signal combination means, and a pair of second signal extraction means provided at the input terminals of the second signal combination means, and wherein the level difference detection means includes a first level difference detection circuit connected to the pair of first signal extraction means for detecting a difference in level between components of the first pilot signal at the input terminals of the first signal combination means, and a second level difference detection circuit connected to the pair of second signal extraction means for detecting a difference in level between components of the second pilot signal at the input terminals of the second signal combination means.

14. The feedforward-type distortion compensation circuit as claimed in claim 1, further comprising a pair of first signal extraction means provided at the input terminals of the first signal combination means, and a pair of second signal extraction means provided at the input terminals of the second signal combination means, and wherein the level difference detection means includes a single level difference detection circuit, and switch means for selectively coupling the first signal extraction means or the second signal extraction means to the level difference detection means.

15. The feedforward-type distortion compensation circuit as claimed in claim 1, wherein the control means adjusts the first variable attenuation means using the difference in level of the components of the first pilot signal between the input terminals of the first signal combination means as an adjustment amount, adjusts the first variable phase shifting means using the difference in phase of the components of the first pilot signal between the input terminals of the first signal combination means as an adjustment amount, adjusts the second variable attenuation means using the difference in level of the components of the second pilot signal between the input terminals of the second signal combination means as an adjustment amount, and adjusts the second variable phase shifting means using the difference in phase of the components of the second pilot signal between the input terminals of the second signal combination means as an adjustment amount.

* * * * *